United States Patent [19]

Langman et al.

[11] Patent Number: 4,631,160
[45] Date of Patent: Dec. 23, 1986

[54] METHOD OF MANUFACTURING CERAMIC SUBSTRATE FOR FINE-LINE ELECTRICAL CIRCUITRY

[75] Inventors: Richard A. Langman, Lakewood; Donald R. Giovanini, Arvada; Michael P. Letzig, Broomfield, all of Colo.

[73] Assignee: Coors Porcelain Company, Golden, Colo.

[21] Appl. No.: 318,289

[22] Filed: Nov. 4, 1981

Related U.S. Application Data

[62] Division of Ser. No. 216,397, Dec. 15, 1980, Pat. No. 4,340,635.

[51] Int. Cl.⁴ ............................................. C04B 33/32
[52] U.S. Cl. ...................................... 264/62; 264/13; 264/60; 264/66
[58] Field of Search ....................... 264/13, 62, 66, 60

[56] References Cited

U.S. PATENT DOCUMENTS 3,652,378  3/1972  Mistler ................................. 264/60
3,717,487  2/1973  Hurley ................................. 264/61
4,294,635  10/1981  Hurley ................................. 264/62
4,313,900  2/1982  Gonzales ............................. 264/62

OTHER PUBLICATIONS

Kingery, *Introduction to Ceramics*, 1967, pp. 481-486.

Primary Examiner—Donald Czaja
Assistant Examiner—Mary Lynn Fertig
Attorney, Agent, or Firm—Sheridan, Ross & McIntosh

[57] ABSTRACT

In accordance with the invention there is provided a sintered monolithic ceramic substrate for fine-line electrical circuitry, the substrate comprising a base layer containing at least 90% by weight crystalline alumina or beryllia and a thin upper layer containing at least 90% by weight crystalline material the same as that of the base layer but with an average grain size less than that of the crystalline material of the base layer, the upper layer having an irregular interface with the base layer but a planar upper surface with minimal surface irregularities for improved reception of the fine-line circuitry to be applied. Further in accordance with the invention such substrate is made by first forming and firing a ceramic plate of alumina or beryllia ceramic to provide the base layer and then applying and firing a coating of fine grain alumina or beryllia, as the case may be, on the plate to provide the upper layer.

9 Claims, 2 Drawing Figures

METHOD OF MANUFACTURING CERAMIC SUBSTRATE FOR FINE-LINE ELECTRICAL CIRCUITRY

This is a division of application Ser. No. 216,397 filed Dec. 15, 1980, and now U.S. Pat. No. 4,340,635 issued July 20, 1982.

TECHNICAL FIELD

This invention relates to ceramic substrates for fine-line electrical circuitry and to a method for the manufacture thereof.

BACKGROUND ART

In the electronics industry ceramic substrates are used for mounting semi-conductor chips or the like and for printing, depositing by vapor deposition, or otherwise applying the electrical circuitry associated with the chips. As the electronics art progresses, there is an ever increasing need for more electrical circuitry per unit area of the substrate. This, in turn, requires that the conductive paths applied to the substrate to provide the circuitry be of decreasing width so as to occupy less surface area per unit length of the conductive path. Such fine-line circuitry imposes a requirement that the substrate surface to which the circuitry is applied have improved planarity, i.e. minimal surface defects such as pits and voids.

Ceramic substrates for such end use are conventionally made of alumina ceramic though beryllia can be used where very high thermal conductivity is desired, albeit at higher cost. But all such ceramics are very hard and hence surface polishing is difficult and expensive. Further, whereas polishing does impart smoothness, it does not necessarily eliminate surface defects, such as relatively deep pits, which cause difficulty in the attainment of a good fine-line circuitry pattern. The conventional solution to the problem of surface defects is to apply a thin layer of glaze, i.e. a glass, to the surface of the ceramic. However, the application of glaze results in several undesirable characteristics such as reductions in adhesion, thermal conductivity, chemical resistance and electrical insulation between adjacent conductive paths in the circuitry. This is because glass is much inferior to alumina or beryllia ceramic in all these respects.

DISCLOSURE OF INVENTION

In accordance with the present invention, the substrate is formed of a sintered monolithic ceramic having a relatively thick base layer and a thin upper layer which has a relatively planar upper surface and a relatively irregular interface with the base layer, each of the base and upper layers containing at least about 90% by weight crystalline material, the crystalline material of the base layer being substantially all alumina or beryllia and the crystalline material of the upper layer being substantially all the same as that of the base layer but having an average grain size less than, and preferably not more than one-half, that of the base layer. In the preferred embodiments each of the layers contains at least about 95% by weight of the crystalline material and at least the base layer additionally contains a glassy phase.

Hence, the upper surface of the substrate to which the circuitry pattern is applied has all the desirable properties characteristic of alumina, or beryllia as the case may be, and is additionally substantially planar, i.e. with minimal surface defects, the upper layer of the monolithic structure functioning to fill the surface defects of the base layer to provide the desired relatively level, defect-free surface.

Further in accordance with the invention, such substrate is made by first forming and sintering a plate of the alumina or beryllia ceramic (which, in the final structure serves as the base layer), and then coating at least one of the opposed surfaces of the plate with a thin layer of the ceramic which serves as the upper layer of the substrate, the substrate then again being fired to sinter the upper layer. The particulate alumina or beryllia used in the thin coating which provides the upper layer is of smaller average particle size, preferably no more than one-half, the average particle size of the particulate alumina used in the raw batch for forming the plate, i.e. the base layer, thereby assuring that the coating performs its intended function of filling the surface defects in the plate to provide the desired substantially planar defect-free surface, and also assuring that the final post-fired grain size of the alumina in the upper layer is less than that of the post-fired crystalline material in the base layer. Also, because the particle size of the ceramic of the coating is so small, the ceramic is more reactive and hence can be fired to a sintered monolithic structure at a lower temperature thereby reducing the amount of grain growth during firing.

The preferred method for making a plate which is to serve as the base layer comprises the steps of: (1) mixing the raw batch in the form of an aqueous slurry which, in addition to the ceramic ingredients, includes a small amount of wax or the like organic binder; (2) spray drying the batch; (3) dry pressing the spray dried batch into the desired plates, and then; (4) firing the plates to burn out or vaporize the organic binder and to sinter the ceramic. This method for forming the plates is advantageous for a number of reasons, as compared to other methods which can be used such, for example, as that of cutting the plates from a cast tape formed of the desired raw batch formulation. The chief advantage of the spray dry-dry press method is that it allows greater freedom in choice of plate thickness and shape with minimal scrap loss. The usual disadvantage of the spray dry-dry press method is that the plates so manufactured have surfaces which are characterized by a regular or irregular pattern of surface defects. However, by the practice of the present invention this disadvantage is minimized.

BEST MODE FOR CARRYING OUT THE INVENTION

Figure 1:
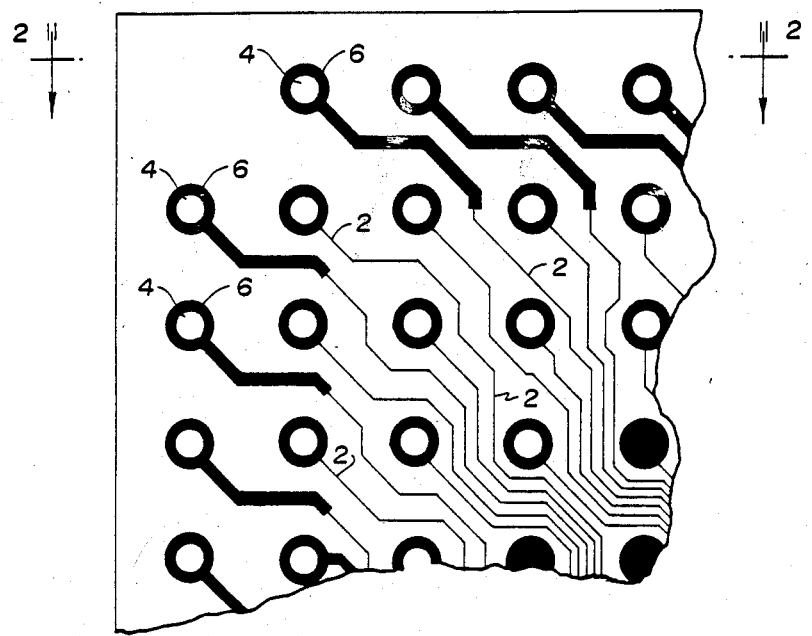
FIG. 1 is an enlarged partial top view of a ceramic substrate made in accordance with the invention showing fine-line electrical circuitry as would typically be applied to the substrate.

Raw Batch for Forming the Plate Which Serves as the Base Layer

As has been stated, it is preferred that the base layer of the substrate be of alumina ceramic and hence in the following preferred embodiment alumina ceramic is used. Where other ceramic, for example, beryllia, is desired, it is simply a matter of substituting beryllium oxide for aluminum oxide in the raw batch for forming the plate with perhaps other minor adjustments in other ingredients in the formulation as well known to those skilled in the art. In all cases it is preferred that the base layer contain a glassy phase and hence that the ceramic formulation used to form the plate which is to serve as the base layer contain a small amount of silica, as such or in combined form, and preferably also a small amount of an alkaline earth oxide, talc or the like.

A typical raw batch formulation for making the plate is:

| Ingredient | Percent by Weight |
|---|---|
| Alumina | 96.6 |
| Silica | 2.3 |
| Magnesia | .8 |
| Other (calcia, iron oxide, etc.) | .3 |

The alumina should preferably be alpha alumina. The raw batch is mixed and further reduced in particle size by ball milling, the final average particle size of the batch, and hence of the alumina therein, after ball milling preferably being from 3 to 5 microns, and preferably with a particle size distribution of from about 0.5 microns to 20 microns.

During or subsequent to ball milling the ceramic ingredients are formed into an aqueous slurry containing a small amount of wax or the like organic binder. As is well known to those skilled in the art, this is best accomplished by mixing an aqueous emulsion of wax with the ceramic formulation, the amount of wax used being such that on a dry weight basis the formulation contains from about 4 to 8 percent of the wax. Such slurry is then spray dried in a conventional spray drying operation. Briefly, such an operation involves spraying the emulsion in the form of small droplets from the top of a tower in which warm air passes upwardly such that the water in the droplets is evaporated, the product accumulating at the bottom of the tower being tiny generally spherical beads of the wax bonded ceramic batch typically having a variated bead size ranging from about 0.0025 to 0.0075 inches.

It should be understood that whereas the use of spray drying is preferred for preparation of the batch to be formed into the plate, such is not essential to the practice of the invention even where the plates are to be formed by dry pressing, as is preferred. The advantage to spray dried material is its high flowability which simplifies feeding the batch to the dies, and filling the dies, in the dry pressing operation to follow.

Plate Forming

The plates are preferably formed by dry pressing the spray dried batch in matched metal dies of the desired shape and size, the female die having an opening, generally flat, of the dimensions desired, and the male die being in the form of a punch which fits snuggly into the female die for applying pressure to the spray dried batch metered into the female die, all as well known in the art. Where it is desired that the plate have openings therethrough, the surface of one of the dies is provided with pins, of the desired dimensions and at the desired locations, which register with openings in the other die upon the dies being mated together with the spray dried material therebetween. The pressure applied in the dry pressing of the plates should preferably be from 10,000 to 15,000 lbs. per square inch. It will be understood, of course, that during the subsequent firing operation wherein the organic binder is vaporized or burned out and wherein the ceramic is sintered, there is some shrinkage in all dimensions, generally about 15 percent, and hence the dry pressed plates of the raw batch are made to commensurately greater dimensions than those desired for the final fired plates. In the preferred embodiments of the present invention the thickness of the base layer, and hence the thickness of the fired plate, is typically from about 0.025 to 0.25 inches.

Plate Firing Operation

The plates formed of the raw batch are next fired to burn out or vaporize the organic binder and sinter the ceramic. As is well known by those skilled in the art, the preferred firing temperature depends on the precise formulation of the ceramic. For alumina ceramic firing temperatures of from 1575° to 1675° C. are typical, the preferred firing temperature for the alumina ceramic batch formulation set forth above being about 1640° C. with a 5 hour soak at that temperature. The firing can be in an ordinary ambient, i.e. oxidizing, atmosphere.

During the latter stages of the firing operation wherein the ceramic sinters, there is interaction between the silica, the magnesia and a small amount of the alumina to form a glassy phase and there is some growth in the grain size of the crystalline alumina, the final average grain size of the crystalline alumina, after firing being from about 6 to 8 microns.

Raw Batch for Forming the Coating Which Serves as the Upper Layer

The raw batch for the coating to be applied to the plate and then fired to provide the upper layer should contain at least 90% by weight, and preferably more than 95% by weight, alumina, any remainder being substantially all silica, as such or in combined form, and other glass formers such as alkaline earth oxide, talc or the like which react with silica to form glass. Whereas it is desirable that there be a small amount of glassy phase in the upper layer at least at its interface with the base layer, the inclusion of glass formers in the raw batch for the coating is not always essential to attain this end since if the plate to which the coating is applied itself contains a glassy phase, as is desired, then the glass present at the interface can be sufficient, and can sufficiently migrate during the firing of the coating, to provide a glassy phase to the upper layer at the interface. Hence, in the preferred embodiments whereas the raw batch for forming the plates preferably contains glass formers (i.e. silica as such or in combined form, and alkaline earth oxides or the like which react with silica to form glass) in an aggregate amount of at least about 2% by weight, it is not necessary, and indeed it is preferred, that the raw batch for the coating contain no more than about 1% by weight in the aggregate, of glass formers.

The following is a typical, preferred raw batch formulation for the coating to be applied to the surface of the plate and then fired to form the upper layer:

| Ingredient | Percent by Weight |
|---|---|
| Alumina | 99.4 |

-continued

| Ingredient | Percent by Weight |
|---|---|
| Silica | .23 |
| Magnesia | .27 |
| Other (calcia, iron oxide, etc.) | .1 |

The alumina in the raw batch for the coating should preferably be alpha alumina of fine particle size, and hence highly reactive. The raw batch is mixed and reduced in particle size by ball milling, the average particle size of the batch, and hence the alumina therein, after ball milling being less than, and preferably no more than one-half, that of the final average particle size of the alumina in the raw batch used for forming the plate. In the preferred embodiments, the final average particle size of the alumina in the coating raw batch is from 1 to 1.5 microns, with a particle size distribution of about 0.1 to 10 microns. During or at the conclusion of the ball milling, the batch is formed into a slurry by mixing with a liquid. Though water can be used as the liquid, it is preferred that the liquid be an organic vehicle containing a small amount of dissolved organic resin which provides good adherence of the slurry to the ceramic plate to which applied. A mixture of about 40% (by weight) butyl carbitol, 40% methyl ethyl ketone and 20% alpha terpinol exemplifies organic vehicles which can be used. The organic resin can, for example, be an acrylic present in an amount of about 3% by weight of the slurry. If water is used as the liquid vehicle, it should preferably also include a small amount of binder, for example, polyvinyl alcohol or a water emulsifiable wax. The preferred ceramic solids content for the slurry will, of course, depend upon the thickness desired for the upper layer which in turn dictates the thickness which should be used for the coating applied. In the preferred embodiments, the thickness of the upper layer after firing is from about 0.0002 to 0.001", typically 0.0005". In general, the thickness of the fired upper layer will be approximately 50% of the thickness of the pre-fired coating after evaporation of the liquid vehicle, and hence in the preferred embodiments, the thickness of such pre-fired coating is from about 0.0004 to 0.002", typically 0.001". A slurry having a solids content of from about 40 to 50 percent by weight has been found to be quite satisfactory.

The coating is formed on the surface of the plate by spraying or otherwise applying the slurry thereto, after which the liquid vehicle is allowed to evaporate.

Firing of the Coating to Form the Upper Layer of the Substrate

The plate with the coating as aforesaid applied is fired to burn out or vaporize any organic binder present and to sinter the resulting thin upper layer to monolithic structure with the base layer. Just as in the case of firing the plate, so here also the precise firing temperature and schedule will depend upon the precise formulation of the ceramic of the upper layer. For the preferred ceramic formulation, as described, for forming the upper layer, it is preferable to use a firing temperature of from about 1500° to 1560° C. with a four to six hour soak at such temperature. The firing can be in the ambience, i.e. an oxidizing atmosphere.

During the firing of the upper layer there is some grain growth of the alumina and if the raw batch formulation used for the upper layer contains any glass formers, there is interaction of these glass formers with each other and with a small amount of the alumina to form a glassy phase. After firing the average grain size of the crystalline alumina in the upper layer in all cases should be less than, and preferably no more than one-half that of the average grain size of the crystalline material in the base layer. In the preferred embodiments, which are accomplished by the preferred formulations and processing described, the final average crystal size of the crystalline alumina in the upper layer is from 2.5 to 3.5 microns as compared to the average crystal size of the crystalline material in the base layer which is from 6 to 8 microns.

During the final firing operation during which the upper layer is sintered, the upper layer forms a monolithic structure with the base layer and, in doing so, fills substantially all the surface irregularities of the base layer to the end that the interface between the upper layer and the base layer is irregular as compared to the relatively planar upper surface of the upper layer which is substantially free of surface defects which would otherwise render difficult the attainment of a good fine-line circuitry pattern on the substrate.

FIG. 1 shows a typical fine-line circuitry pattern subsequently applied to the substrate, the thin lines 2 of conductive material being applied to the relatively planar upper surface of the substrate as by printing, thin film deposition, photolithographic techniques or the like, well known in the art. In the particular embodiment shown, the substrate has a plurality of openings 4 therethrough for the reception of electrical leads which make electrical contact with the portions 6 of the circuitry pattern surrounding the openings.

Figure 2:
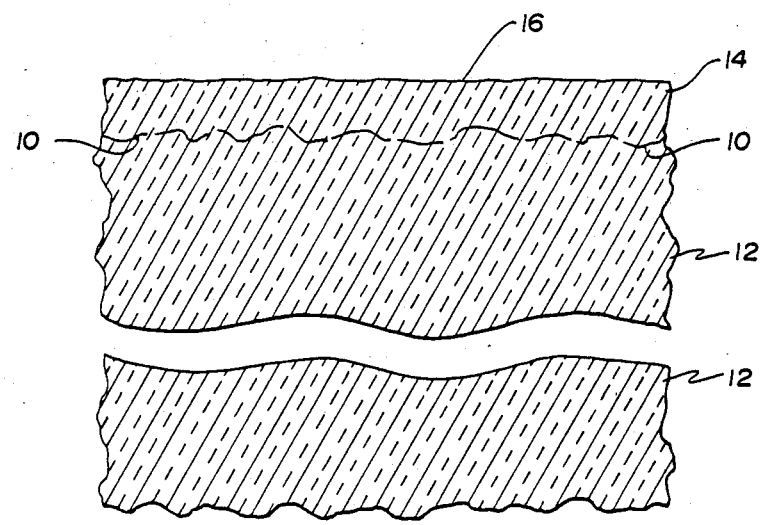
FIG. 2 is a cross-sectional view, taken on the line 2—2 of FIG. 1, showing a small cross-sectional portion of the substrate in much enlarged but not precise scale, illustrating the base and upper layers and the interface therebetween.

FIG. 2 illustrates the irregular interface 10 between the base layer 12 and the upper layer 14, the upper surface 16 of the upper layer being relatively planar and free of surface defects.

Because of the relatively defect-free substrate surface of the monolithic two-layer substrate, application of the fine-line circuitry pattern is optimized with increased assurance against shorts or breaks in the circuitry.

It will be understood that while the invention has been described in details specifically with reference to preferred embodiments thereof, various changes and modifications may be made all within the full and intended scope of the claims which follow.

What is claimed is:

1. A method for making a sintered monolithic ceramic substrate for fine-line electrical circuitry comprising:
   (1) forming a raw ceramic batch containing as its ceramic ingredients at least 90% by weight particulate crystalline material selected from the group consisting of alumina and beryllia;
   (2) forming said raw batch into a plate;
   (3) firing said plate to sintering temperature thereby to form a sintered plate;
   (4) coating a surface of the plate with a thin layer of ceramic containing as its ceramic ingredients at least 90% by weight particulate crystalline material substantially all of which is the same as that used in the raw batch for said plate but the average particle size of which is less than that of the crystalline material used in said raw batch for said plate; and
   (5) firing said plate to sinter said layer.

2. A method as set forth in claim 1 wherein the raw batch for forming said plate contains glass formers.

3. A method as set forth in claim 2 wherein said raw batch for forming said plate and said coating contain at least 95% of said crystalline material.

4. A method as set forth in claim 1 wherein the average particle size of the crystalline material in said coating is no more than one-half that of the crystalline material in the raw batch for said plate.

5. A method as set forth in claim 1 wherein the crystalline material is alumina.

6. A method as set forth in claim 1 wherein said raw batch is formed into said plate by dry pressing.

7. A method as set forth in claim 6 wherein said raw batch is spray dried prior to dry pressing thereof to form the plate.

8. A method as set forth in claim 1 wherein the plate is fired at a first predetermined sintering temperature and the thin upper layer is fired at a second predetermined sintering temperature which is lower than the first mentioned temperature.

9. A method as set forth in claim 8 wherein the plate is fired at a temperature from about 1575° to 1675° C. for about five hours and the upper layer is fired at a temperature of from about 1500° to 1560° C. for about four to six hours.

* * * * *